(12) United States Patent
Tajiri

(10) Patent No.: US 7,397,688 B2
(45) Date of Patent: Jul. 8, 2008

(54) NONVOLATILE VARIABLE RESISTOR, MEMORY DEVICE, AND SCALING METHOD OF NONVOLATILE VARIABLE RESISTOR

(75) Inventor: Masayuki Tajiri, Tenri (JP)

(73) Assignee: Sharp Kabushiki Kaisha, Osaka (JP)

(*) Notice: Subject to any disclaimer, the term of this patent is extended or adjusted under 35 U.S.C. 154(b) by 403 days.

(21) Appl. No.: 10/700,467

(22) Filed: Nov. 5, 2003

(65) Prior Publication Data
US 2004/0090815 A1     May 13, 2004

(30) Foreign Application Priority Data
Nov. 8, 2002   (JP) ............................. 2002-325527

(51) Int. Cl.
*G11C 11/00* (2006.01)
(52) U.S. Cl. ........................ 365/148; 365/158; 365/163; 365/100
(58) Field of Classification Search ................ 365/148, 365/100, 145, 163, 158; 257/379–380, E27.016, 257/E27.071, E27.101, E21.004, 2, 4, E45.002, 257/E27.004; 438/95, 257
See application file for complete search history.

(56) References Cited

U.S. PATENT DOCUMENTS

| | | | | |
|---|---|---|---|---|
| 4,479,106 A | * | 10/1984 | Shimizu et al. | ............. 338/160 |
| 6,031,287 A | | 2/2000 | Harshfield | |
| 6,104,055 A | * | 8/2000 | Watanabe | .................... 257/309 |
| 6,144,286 A | * | 11/2000 | Moos et al. | ............... 338/22 R |
| 6,204,139 B1 | | 3/2001 | Liu et al. | |
| 6,434,815 B1 | * | 8/2002 | Onishi et al. | ................. 29/621 |
| 6,693,821 B2 | * | 2/2004 | Hsu et al. | ................... 365/158 |
| 6,762,481 B2 | * | 7/2004 | Liu et al. | .................... 257/595 |
| 6,891,749 B2 | * | 5/2005 | Campbell et al. | ........... 365/163 |
| 2003/0025587 A1 | * | 2/2003 | Whitney et al. | ........... 338/22 R |
| 2004/0096699 A1 | * | 5/2004 | Doerr et al. | ................. 428/692 |

FOREIGN PATENT DOCUMENTS

| | | |
|---|---|---|
| KR | 1999-0077881 A | 10/1999 |
| WO | 00/57498 A | 9/2000 |

OTHER PUBLICATIONS

Korean Office Action mailed Sep. 23, 2005 in corresponding Korean application No. 10-2003-007516.
Patent Abstract of Japan, 11-266043, Sep. 28, 1999.
European Search Report mailed Dec. 5, 2005 in corresponding EP application No. 03025694.5-2203.

(Continued)

*Primary Examiner*—David Lam
(74) *Attorney, Agent, or Firm*—Nixon & Vanderhye, P.C.

(57) ABSTRACT

Provided are a nonvolatile variable resistor with a structure capable of suppressing an increase in resistance in a case where scaling is applied to reduce a projected area on a plane, a memory device using the nonvolatile variable resistor, and a scaling method of a nonvolatile variable resistor. A first electrode and a second electrode formed on a substrate face each other in a direction of a surface of the substrate. The first electrode is used as an inner electrode, a nonvolatile variable resistance body is formed on an outer surface of the first electrode and the second electrode is formed as an outer electrode on an outer surface of the nonvolatile variable resistance body.

16 Claims, 14 Drawing Sheets

OTHER PUBLICATIONS

Patent Abstracts of Japan, vol. 014, No. 553 (E-1010), Dec. 7, 1990 & JP 02 238659 a (Seiko Epson Corp.), Sep. 20, 1990.

Liu et al, "Electric-Pulse-Induced Reversible Resistance Change Effect in Magnetoresistive Films", Applied Physics Letters, AIP, American Institute of Physics, Melville, NY, vol. 76, No. 19, May 8, 2000, pp. 2749-2751.

Hao et al, "Electronic Transport and Magnetic Properties in $(La_{1-x} Gd_x)_{0.67} Ca_{0.33}MnO_3$ Perovskites" Materials Science and Engineering B83 (2001), pp. 70-73.

\* cited by examiner

| STRUCTURE | BEFORE SCALING | | AFTER SCALING (1/k TIMES) (t: NO SCALING IS APPLIED) | | $R_s/R_o$ |
|---|---|---|---|---|---|
| | AREA | RESISTANCE | AREA | RESISTANCE | |
| CYLINDER | $S_o = 2\pi rh$ | $R_o = \rho t / 2\pi rh$ | $S_s = 2\pi rh/k$ | $R_s = \rho tk/2\pi rh$ | $k$ |
| PRISM | $S_o = 2(a+b)h$ | $R_o = \rho t / 2(a+b)h$ | $S_s = 2(a+b)h/k$ | $R_s = \rho tk/2(a+b)h$ | $k$ |
| CONVENTIONAL | $S_o = ab$ | $R_o = \rho t / ab$ | $S_s = ab/k^2$ | $R_s = \rho tk^2/ab$ | $k^2$ |

FIG. 3

| STRUCTURE | | BEFORE SCALING | AFTER SCALING (1/k TIMES) ($t$: NO SCALING IS APPLIED) | $R_s/R_o$ |
|---|---|---|---|---|
| | | AREA, RESISTANCE | AREA, RESISTANCE | |
| CYLINDER | | $S_o = 2\pi r h$  $R_o = \rho t / 2\pi r h$ | $S_s = 2\pi r h / k$  $R_s = \rho t / 2\pi r h$ | 1 |
| PRISM | | $S_o = 2(a+b)h$  $R_o = \rho t / 2(a+b)h$ | $S_s = 2(a+b)h/k$  $R_s = \rho t / 2(a+b)h$ | 1 |
| CONVEN-TIONAL | | $S_o = ab$  $R_o = \rho t / ab$ | $S_s = ab/k^2$  $R_s = \rho t k / ab$ | $k$ |

US 7,397,688 B2

NONVOLATILE VARIABLE RESISTOR, MEMORY DEVICE, AND SCALING METHOD OF NONVOLATILE VARIABLE RESISTOR

BACKGROUND OF THE INVENTION

The invention relates to a nonvolatile variable resistor in which data is held even when a power supply is turned off, a memory device using the nonvolatile variable resistor, and a scaling method of a nonvolatile variable resistor.

DESCRIPTION OF THE RELATED ART

Among nonvolatile memories undergoing current research, great attention is focused on a memory device using nonvolatile variable resistors in each of which a difference in resistance value (hereinafter, simply referred to as "resistance" in some cases) is read in a current as in MRAM (Magneto-resistive Random Access Memory) or OUM (Ovonic Universal Memory) because of its high write durability and high speed operation. This memory has an advantage that no dimensional limit in accordance with statistical physics exists in microfabrication, which DRAM, flash memory and FeRAM (Ferroelectric Random Access Memory) suffer.

FIG. 7 is a descriptive view showing an outline of a memory device using a conventional nonvolatile variable resistor. Such a nonvolatile variable resistor Rv is disclosed, for example, in U.S. Pat. No. 6,204,139, B1. A reference numerical 1 indicates a first electrode, a nonvolatile variable resistance body 2 is formed in the form of a film on the first electrode 1 and a second electrode 3 is formed on the nonvolatile variable resistance body 2, thereby constituting the nonvolatile variable resistor Rv. The nonvolatile variable resistor Rv is formed on a surface of a substrate 9 with an insulating property. By applying a pulse power supply Vp between the first electrode 1 and the second electrode 3 of the nonvolatile variable resistor Rv with such a structure, the nonvolatile variable resistor Rv works as a memory element (a memory device) operable even at ordinary temperature. Examples of the nonvolatile variable resistance body 2 that have been known include a manganese oxide of a perovskite structure, such as $Pr_{0.7}Ca_{0.3}MnO_3$. While a resistance value of the nonvolatile variable resistance body 2 is changed by a pulse voltage applied thereto, the nonvolatile variable resistance body 2 has a nonvolatility to sustain the resistance value thereof even when power supply is turned off. Arrangement of a large number of nonvolatile variable devices Rv in a matrix enables a memory device to be formed on the substrate 9.

FIG. 8 is a graph showing a way of changing a resistance value with respect to application of a voltage pulse in the memory device of FIG. 7. The abscissa represents the number of applied pubes (applied pulse code) and the ordinate represents a resistance value (Ω). In FIG. 7, a voltage of an applied pulse is 2.9 V, a pulse width is 17 ns, and a pulse polarity is positive (+) or negative (−). For example, a first pulse (applied pulse code 1) is negative and a resistance value after application of the first pulse changes (increases) from $10^4$ to $10^6$. A second pulse (applied pulse code 2) is positive, and a resistance value after application of the second pulse changes (decreases) from $10^6$ to $10^4$. This difference (change) in resistance can be stored as a logical signal in correspondence to a logical value 1 or 0. Since the resistance value can be sustained when a power supply is turned oft the memory device can be used as nonvolatile.

FIGS. 9 and 10 are circuit diagrams each showing an example memory cell in a memory device using a conventional nonvolatile variable resistor. FIG. 9 shows a memory cell using a transistor as a selective device selecting one from the nonvolatile variable resistors Rv arranged in a matrix (hereinafter, the memory cell being referred to as a 1T1R type memory cell), wherein the transistor is constituted of a MOS transistor 5. The memory cell is constituted of the MOS transistor 5 and the nonvolatile variable resistor Rv. FIG. 10 shows a memory cell using a diode as a selective device selecting one from the nonvolatile variable resistors Rv arranged in a matrix (hereinafter, the memory cell being referred to as a 1D1R type memory cell). The memory cell is constituted of the diode 6 and the nonvolatile variable resistor Rv.

In the 1T1R type memory cell, the MOS transistor 5 includes a gate electrode, a source (a source region) and a drain (a drain region). The gate electrode is connected to a word line WL of the memory device, and the source and the drain are connected to a source line SL and one terminal of the nonvolatile variable resistor Rv, respectively. The other terminal of the nonvolatile variable resistor Rv is connected to the bit line BL. In the 1D1R type memory cell of FIG. 10, the anode of the diode 6 is connected to a word line WL and the cathode thereof is connected to a bit line BL.

In a case where rewrite (write or reset) is conducted in a 1T1R type memory cell, a potential on a word line WL connected to the gate electrode of a memory cell to be selected (hereinafter, referred to as a selective cell) is at first raised to turn on the MOS transistor 5. Then, a potential difference (a voltage) is applied between the bit line BL and a source line SL of the selective cell to thereby apply a proper voltage between the first electrode 1 and the second electrode 3 of the nonvolatile variable resistor Rv and to in turn change a resistance of the nonvolatile variable resistance body 2.

As used herein, an operation for raising a resistance is a "write" and an operation for reducing a resistance is "reset". In a write operation, a positive voltage pulse is applied onto the bit line BL, while the source line SL is driven to a ground potential. In "reset", the bit line BL is driven to the ground potential, while a positive voltage pulse is applied onto the source line SL. That is, since opposite pulses (pulses of different polarities, positive and negative) are respectively applied to the nonvolatile variable resistance body 2 during the write and reset operations, resistance can be changed.

The following method has also been available as another rewrite methods in a 1T1R type memory cell. In this method, in write, similar to the write described above, a positive voltage pulse is applied onto the bit line BL, while the source line SL is driven to ground potential. In reset, the bit line BL is driven to ground potential, while a voltage (an amplitude) of a positive voltage pulse applied onto the source line SL is rendered smaller and a pulse width thereof is rendered longer than in the write.

While a method applied in a case where read is conducted in a 1T1R type memory cell is fundamentally similar to that in a case where rewrite is conducted, a positive voltage applied onto the bit line BL or the source line SL is rendered smaller to thereby prevent read destruction.

In a case where rewrite is conducted in a 1D1R type memory cell, a potential on the word line WL of a selective cell is at first raised, while the bit line BL is driven to ground potential. At this time, in memory cells other than the selective cell (the memory cells being hereinafter referred to as non-selective cells), word lines WL are driven to ground potential while potentials on bit lines BL are set to a positive potential to thereby cause the diodes 6 to take rectifying action, therefore applying no voltage to the non-selective cells. A voltage (an amplitude) of a voltage pulse in reset renders a voltage of a voltage pulse in write to be smaller, and a pulse width is rendered longer than in write.

In a 1D1R type memory cell, while a method in a case where read is conducted is fundamentally similar to that in a case where rewrite is conducted, a voltage applied onto the bit line BL (or the source line SL) is rendered smaller to thereby prevent read destruction.

FIG. 11 is a schematic sectional view of a conventional 1T1R type memory cell. Note that oblique hatching indicating a section will not be shown (the above being hereinafter adopted in the description to come). Formed on a substrate 10 made of single crystal silicon or the like are the drain (a drain region) 5d and the source (a source region) 5s of the MOS transistor 5. Formed in an insulating layer 11 deposited on a surface of the substrate 10 is a gate electrode 5g at a position corresponding to the drain 5d and the source 5s. The drain 5d is connected to the first electrode 1 of the nonvolatile variable resistor Rv formed on a surface of the insulating layer 11 by way of a plug 7 passing through the insulating layer 11.

The nonvolatile variable resistance body 2 and the second electrode 3 are further sequentially laminated on the first electrode 1 to constitute the nonvolatile variable resistor Rv. That is, the first electrode 1 and the second electrode 3 of the nonvolatile variable resistor Rv are constituted such that the first and second electrodes 1 and 3 face each other in a direction intersecting a surface of the substrate 10. The nonvolatile variable resistor Rv is protected by an insulating layer 12 formed on the insulating layer 11 to planarize a surface of the memory cell. The bit line BL is formed on the surface of the insulating layer 11 and the second electrode 3 is connected to the bit line BL. Note that the gate electrode 5g extends and is connected to the word line WL and the source 5s extends and is connected to the source line SL.

FIG. 12 is a schematic sectional view of a conventional 1D1R type memory cell. Corresponding constituents similar to those of FIG. 11 are denoted by the same symbols as in FIG. 11 and descriptions thereof will not be repeated. Note that the substrate 10 is not shown. A diode 6, including a semiconductor PN junction, is formed between the word line WL and the first electrode 1, and an anode 6p of the diode 6 is connected to the word line WL and a cathode 6n thereof is connected to the first electrode 1. Similar to the case of FIG. 11, sequentially laminated on the first electrode 1 are the nonvolatile variable resistance body 2 and the second electrode 3 to constitute the nonvolatile variable resistor Rv. That is, the first electrode 1 and the second electrode 3 of the nonvolatile variable resistor Rv are constituted such that the first and second electrodes 1 and 3 face each other in a direction intersecting a surface of the substrate 10.

In a memory device, especially a semiconductor memory device (a memory chip) in which a number of memory cells are arranged in a matrix, scaling (proportional reduction in dimension) is applied to a memory cell in accordance with a scaling rule to reduce a projected area on a plane of a memory cell and achieve higher integration, thereby realizing a larger capacity (increase in memory capacity). While the expression of the scaling generally means a proportional reduction in dimension in more of cases, there has been a case where the expression is also used for proportional magnification in dimension (see a third embodiment). When it is necessary to show a difference therebetween, the expression of reduction scaling or magnification scaling is used for the purpose.

Larger capacity has also been requested for memory devices using nonvolatile variable resistors Rv. Accordingly, investigations have attempted to reduce a projected area on a plane of a memory cell (especially, a projected area on a plane of the nonvolatile variable resistance body) by means of scaling. However, if a projected area on a plane of the nonvolatile variable resistance body (the first electrode and the second electrode) of a conventional nonvolatile variable resistor is reduced by means of scaling, resistance increases in inverse proportion to the reduction ratio of the projected area. This leads to a problem described below: a time constant ($\tau$=CR) in a memory cell increases and thereby slows operation.

FIGS. 13A and 13B are descriptive views showing a way of scaling in a conventional nonvolatile variable resistor. FIG. 13A is a perspective view of the nonvolatile variable resistor Rv before scaling and FIG. 13B is a perspective view of the nonvolatile variable resistor Rv after scaling is applied at a magnification of 1/kX (k>1) to the nonvolatile variable resistor Rv in FIG. 13A. Areas of the first electrode 1, the nonvolatile variable resistance body 2 and the second electrode 3 are shown in shapes of the same rectangles for simplicity. The dimensions before scaling are a length of the shorter side a, a length of the longer side b, while the dimensions after scaling are a length of the shorter side a/k and a length of the longer side b/k. Note that a film thickness of the nonvolatile variable resistance body 2 is t/k for a case applied with scaling or t for a case not applied with scaling.

A surface area So of the first electrode 1 and the second electrode 3 facing each other before scaling are ab (the length of the shorter side a×the length of the longer side b). A surface area Ss of the first electrode 1 and the second electrode 3 facing each other after scaling are ab/$k^2$ (the length of the shorter side a/k×the length of the longer side b/k). A resistance "Ro" before scaling is theoretically Ro=$\rho$t/ab if a resistivity of the nonvolatile variable resistance body 2 is $\rho$. A resistance Rs after scaling can be calculated in a similar manner. That is, in a case where no scaling is applied to a film thickness t, Rs=$\rho tk^2$/ab=$k^2$Ro and a resistance is increased $k^2$ times that before scaling by the scaling. In a case where scaling is applied to a film thickness t, Rs=$\rho$tk/ab=kRo and a resistance is increased k times that before scaling by the scaling. In any of the cases where scaling is applied to a film thickness t of the nonvolatile variable resistance body 2 and where no scaling is applied to a film thickness t of the nonvolatile variable resistance body 2, a resistance of the nonvolatile variable resistor Rv unavoidably increases.

FIGS. 14A and 14B are graphs for describing reduction in characteristic accompanied by an increase in resistance of a nonvolatile variable resistor. FIG. 14A shows a change (an increase) in resistance accompanied by scaling of the nonvolatile variable resistor Rv including the first and second electrodes 1 and 3 in the shape of a square having a side a μm in length, and facing each other. FIG. 14B shows ways of a change in potential on a bit line BL at respective time constants $\tau$, as parameters, corresponding to increases in resistance.

In FIG. 14A, the abscissa represents a length of a side a (μm) of a square and the ordinate represents a resistance value, as a relative value, at a length of the side a. A resistance value is plotted in the graph with normalization that a reading on the ordinate in a case of a length a=1 (at 1 on a scale of the abscissa) is imparted with a value of 100. For example, in a case where reduction is effected to a=0.2 (μm) at k=5, a resistance value amounts to a value $k^2$ (25) times before scaling, that is 2500, in accordance with the calculation formula described above if no scaling is applied to a film thickness t.

In FIG. 14B, the abscissa represents time (μs) while the ordinate represents a relative potential with a saturated value of a potential on a bit line BL being set to 100. A time constant τ of a curve T1 is 10 µs, a time constant τ of a curve T2 is 1 µs, a time constant τ of a curve T3 is 100 ns and a time constant τ of a curve T4 is 10 ns. For example, in a case where, in the curve T3, a resistance of 100 is increased 25 times (that is to resistance of 2500), a time constant τ (=CR) increases from 100 ns to 2500 ns (2.5 µs) in accordance with a simple calculation. That is, a change in potential on a bit line BL, which was on the curve T3, is slowed to a change in potential on a curve slower than on the curve T2, resulting in reduction in operating speed of a memory cell. In such a way, a problem has occurred tat in a conventional nonvolatile variable resistor Rv, an operating speed, especially a read speed, is decreased in accordance with an increase in resistance by scaling.

BRIEF SUMMARY

The invention has been made in light of such problems, and it is an object of the invention to provide a nonvolatile variable resistor of a structure capable of suppressing an increase in resistance in a case where scaling is applied to reduce a projected area on a plane of the nonvolatile variable resistor.

It is another object of the invention to provide a memory device including nonvolatile variable resistors arranged in a matrix, in which no operating speed is reduced even in scaling by adopting the nonvolatile variable resistors each with a structure capable of suppressing an increase in resistance in a case where scaling is applied to reduce a projected area on a plane of a nonvolatile variable resistor.

It is still another object of the invention to provide a scaling method of a nonvolatile variable resistor capable of preventing an increase in resistance of the nonvolatile variable resistor in a case where scaling is applied to reduce a projected area on a plane of the nonvolatile variable resistor.

A nonvolatile variable resistor includes: a first electrode and a second electrode facing each other and formed on a substrate; and a nonvolatile variable resistance body formed between the first electrode and the second electrode, wherein the first electrode and the second electrode face each other in a direction of a surface of the substrate.

In a nonvolatile variable resistor according to the example embodiment, the nonvolatile variable resistance body is formed on an outer surface of the first electrode, and the second electrode is formed on an outer surface of the nonvolatile variable resistance body.

In a nonvolatile variable resistor according to an example embodiment, the first electrode is columnar or prismatic.

In a nonvolatile variable resistor according to an example embodiment, the nonvolatile variable resistance body is made of a manganese oxide of a perovskite structure.

In a nonvolatile variable resistor according to an example embodiment, the manganese oxide is any of $Pr_{(1-x)}Ca_xMnO_3$, $La_{(1-x)}Ca_xMnO_3$ and $La_{(1-x-y)}Ca_xPb_yMnO_3$.

In a nonvolatile variable resistor according to an example embodiment, the manganese oxide is any of $Pr_{0.7}Ca_{0.3}MnO_3$, $La_{0.65}Ca_{0.35}MnO_3$ and $La_{0.65}Ca_{0.175}Pb_{0.175}MnO_3$.

According to an example embodiment, a memory device has arrangement of memory cells in a matrix on a substrate, each memory device being constituted of a nonvolatile variable resistor and a selective device, connected to the nonvolatile variable resistor, for selecting the nonvolatile variable resistor.

In a memory device according to an example embodiment, the selective device selects one from the nonvolatile variable resistors to control a current applied to the one of the nonvolatile variable resistors.

In a memory device according to an example embodiment, the selective device is a transistor or a diode formed on the substrate.

In a memory device according to an example embodiment, the transistor is a MOS transistor, and a drain of the MOS transistor is connected to the first electrode.

In a memory device according to an example embodiment, a cathode of the diode is connected to the first electrode.

In a memory device according to an example embodiment, the memory cells each have a word line connected to the selective device and a bit line connected to the nonvolatile variable resistor, and the second electrode is connected to the bit line.

According to an example embodiment, a scaling method of a nonvolatile variable resistor including a first electrode and a second electrode facing each other in a direction of a surface of a substrate and formed thereon, and a nonvolatile variable resistance body formed between the first electrode and the second electrode, comprises the steps of applying reduction scaling to a planar dimension of the first electrode; and applying magnification scaling to a height of the first electrode.

In a scaling method of a nonvolatile variable resistor according to an example embodiment, the reduction scaling is applied at a magnification of 1/k times (k>1), while the magnification scaling is applied at a magnification of k times.

Since a first electrode and a second electrode of a nonvolatile variable resistor formed on a substrate face each other in a direction of a surface of the substrate, an increase in resistance of the nonvolatile variable resistor can be suppressed in a case where scaling is applied to the nonvolatile variable resistor to reduce a projected area on a plane thereof. Especially, since a nonvolatile variable resistance body is formed on an outer surface of the first electrode and the second electrode is formed on an outer surface of the nonvolatile variable resistance body, layout thereof and the like are easy, which enables a nonvolatile variable resistor suitable for a memory device with a large capacity to be realized. Furthermore, since the nonvolatile variable resistance body is made of a manganese oxide of a perovskite structure, it is possible to obtain a nonvolatile variable resistor having a stable change in resistance thereof suitable for a memory device.

Since a memory cell is constituted of a nonvolatile variable resistor formed on a substrate so that a first electrode and a second electrode face each other in a direction of a surface thereof, an increase in resistance of the nonvolatile variable resistor can be suppressed and no operation speed (an access time) of the memory device is reduced in a case where scaling is applied to the nonvolatile variable resistor to reduce a projected area on a plane thereof. Especially, in a case where scaling is applied to the nonvolatile variable resistor in a 1T1R type memory cell or a 1D1R type memory cell to reduce a projected area on a plane thereof, an increase in resistance of the nonvolatile variable resistor can be suppressed and no operation speed (an access time) of the memory device is reduced.

Since magnification scaling is applied to the direction of a height in a case where reduction scaling is applied to the nonvolatile variable resistor to reduce a projected area on a plane thereof, it is possible to use a scaling method of a nonvolatile variable resistor capable of suppressing an increase in resistance thereof.

The above and further objects and features will more fully be apparent from the following detailed description with accompanying drawings.

BRIEF DESCRIPTION OF THE DRAWINGS

FIG. 3 is a descriptive representation showing that an increase in resistance due to scaling can be suppressed in the nonvolatile variable resistor according to the first embodiment;

DETAILED DESCRIPTION OF THE PREFERRED EMBODIMENTS

Concrete description will be given of the invention based on the drawings showing embodiments thereof below.

First Embodiment

Figure 1A:
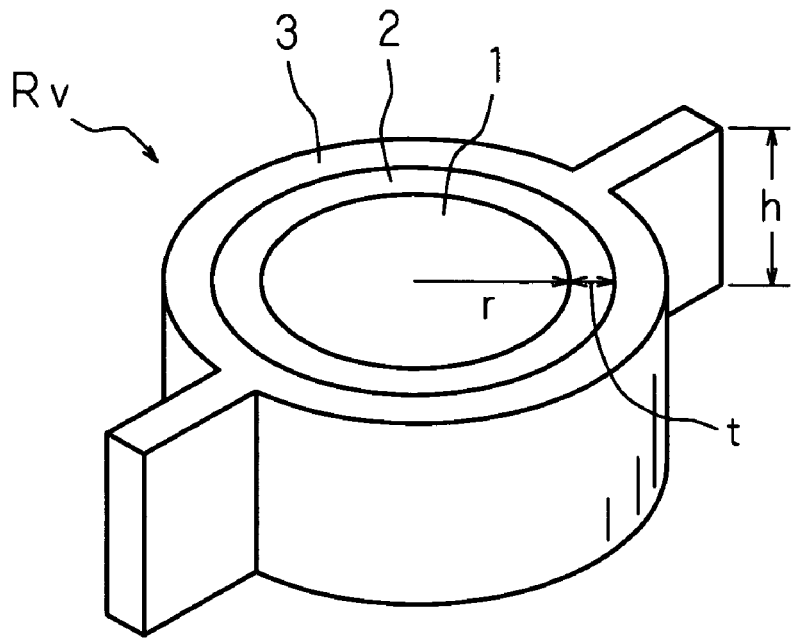
FIGS. 1A and 1B are descriptive views showing a way of scaling in a nonvolatile variable resistor according to a first embodiment.
Figure 1B:
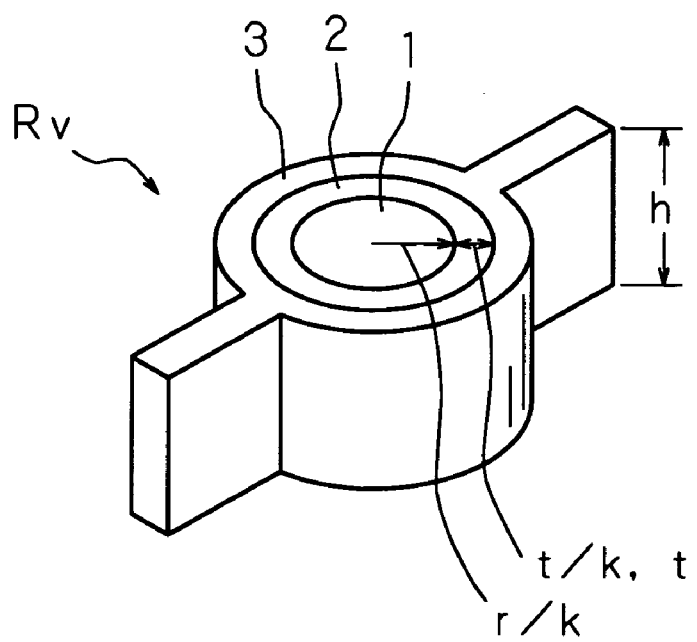

FIGS. 1A and 1B are descriptive views showing a way of scaling in a nonvolatile variable resistor according to a first embodiment. FIG. 1A is a perspective view of the nonvolatile variable resistor Rv before scaling is applied. FIG. 1B is a perspective view of the nonvolatile variable resistor Rv after scaling is applied at a magnification of 1/k times (k>1) thereto. In FIG. 1A, the nonvolatile variable resistor Rv is formed with a first electrode 1 in the shape of a column of a height h and a radius r as an inner electrode. A nonvolatile variable resistance body 2 in a cylindrical shape is formed on an outer surface of the first electrode 1 in a layer with a film thickness t and a second electrode 3 in a cylindrical shape of a radius r+t is formed as an outer electrode on an outer surface of the nonvolatile variable resistance body 2 so as to face the first electrode 1. The second electrode 3 is concentric about the first electrode 1.

In FIG. 1B, the nonvolatile variable resistor Rv takes a new dimension when required by application of scaling at a magnification of 1/k times (k>1) such that a radius of the first electrode 1 is r/k and a height thereof is h (no scaling is applied to the direction of a height). The nonvolatile variable resistance body 2 takes a new dimension when required such that a film thickness is t/k (when scaling is applied to a film thickness t) or else a film thickness is t (when no scaling is applied thereto), and the second electrode 3 takes a new dimension when required such that a radius is [(r+t)/k] (when scaling is applied to a film thickness t) or else a radius is [(r/k)+t] (when no scaling is applied thereto) and is in the shape of a cylinder as an outer electrode. Note that in the calculation of a resistance in the following description, a resistivity of the nonvolatile variable resistance body 2 approximates ρ.

In FIG. 1A, since a surface area So of the first electrode 1 facing the nonvolatile variable resistance body 2 is 2 πrh and a film thickness is t, a resistance Ro before scaling is applied approximates Ro=ρt/2 πrh using the surface area So of the first electrode 1. In FIG. 1B after scaling is applied, a surface area Ss of the first electrode 1 facing the nonvolatile variable resistance body 2 is 2 πrh/k. A resistance Rs after scaling is applied in a case where no scaling is applied to a film thickness t is ρt/Ss=ρtk/2 πrh=kRo. Therefore, in a case where scaling is applied at a magnification of 1/k times, a ratio of the resistance Rs after scaling and the resistance Ro before scaling is k. This shows that scaling in a nonvolatile variable resistor Rv of the embodiment takes a resistance of a value as low as k times that before scaling as compared with an increased resistance of a value $k^2$ times that before scaling in scaling in a conventional nonvolatile variable resistor Rv, showing it possible to suppress an increase in resistance in the embodiment.

The resistance Rs when scaling is applied to a film thickness t is (ρt/k)/Ss=ρt/2πrh=Ro. That is, a resistance increase ratio Rs/Ro caused by scaling at a magnification of 1/k times is 1 without an increase in resistance. This shows that an increase in resistance can be suppressed, which is clear without comparison with an increase to a value k times before scaling in a conventional nonvolatile variable resistor Rv. While an area of a surface of the second electrode 3 facing the nonvolatile variable resistance body 2 is reduced similarly to the case of the surface area (So and Ss) of the first electrode 1, detailed calculation of a surface area will not be described since resistance is calculated with a surface area of the first electrode 1 for approximation.

The nonvolatile variable resistor Rv is formed on a substrate (not shown) and the first electrode 1 and the second electrode 3 are formed on the substrate so that a major dimension (height "h") of the first electrode 1 and a major dimension (height "h") of the second electrode 3 are perpendicular to the substrate and face each other in a direction of a surface of the substrate. In a case where scaling applied to reduce a projected area on a plane of the nonvolatile variable resistor Rv with the nonvolatile variable resistor Rv in a three-dimensional structure as described above, an increase in resistance of the nonvolatile variable resistor Rv can be suppressed. That is, there occurs no increase in resistance accompanied by reduction of a surface area of the first electrode 1 due to scaling, which occurs otherwise in a conventional technique. Note that by using the nonvolatile variable resistor Rv according to the first embodiment in a memory device (memory cell), there can be realized a memory device with a large capacity, in which no reduction in operating speed occurs due to scaling.

By using the first electrode 1 as an inner electrode, forming the nonvolatile variable resistance body 2 on an outer surface of the first electrode 1 and, further, forming the second electrode 3 on an outer surface of the nonvolatile variable resistance body 2, a projected area on a plane of the substrate occupied thereby can be reduced with certainty. That is, since a structure is adopted that the outer surface of the first electrode 1 is surrounded by the nonvolatile variable resistance body 2 and the outer surface of the nonvolatile variable resistance body 2 is surrounded by the second electrode 3, a reduction in a projected area on a plane of the first electrode 1 shows directly a reduction in a projected area of the nonvolatile variable resistor. For example, an area of a surface of the first electrode 1 occupying almost all the bulk of the nonvolatile variable resistor Rv is $\pi r^2$ before scaling, while the area can be reduced to $\pi r^2/k^2$ after scaling at a magnification of 1 k times.

By disposing the nonvolatile variable resistance body 2 on an outer surface of the first electrode 1 and, further, disposing the second electrode 3 on an outer surface of the nonvolatile variable resistance body 2, layout is easy and mask alignment is also easy in a fabrication process thereof, thereby enabling layout at a higher density to be realized. While in the above embodiment, the first electrode 1 is in the shape of a column and the second electrode 3 is in the shape of a cylinder, it makes layout easier to form the first electrode 1 in the shape of a prism, thereby enabling a further higher density to be realized. Note that while a structure of the first electrode 1 of a column or a prism preferably makes layout easy, the structure is not limited thereto and any of three-dimensional shapes (like a pole) analogous thereto may be used. It goes without saying that shapes of the nonvolatile variable resistance body 2 and the second electrode 3 can be properly altered in correspondence to a shape of the first electrode.

A manganese oxide of a perovskite structure has been used as the nonvolatile variable resistance body 2. Especially, as manganese oxides, any of materials expressed by $Pr_{(1-x)}Ca_xMnO_3$, $La_{(1-x)}Ca_xMnO_3$ and $La_{(1-x-y)}Ca_xPb_yMnO_3$ showed a stable and good storage characteristic (generation of a change in resistance accompanied by application of a pulse). To be more specific, $Pr_{0.7}Ca_{0.3}MnO_3$, $La_{0.65}Ca_{0.35}MnO_3$, and $La_{0.65}Ca_{0.175}Pb_{0.175}MnO_3$ each showed a good storage characteristic. A film of the nonvolatile variable resistance body 2 was formed by means of sputtering and patterning thereon was conducted with photolithography.

Films of the first electrode 1 and the second electrode 3 were formed by means of sputtering using platinum or iridium as a target and patterning was conducted with photolithography. A desired resistance value was achieved by adopting dimensions such that a radius r of the first electrode 1 was in the range from about 0.1 to about 0.3 μm, a height h thereof was in the range from about 0.5 to about 1 μm and a film thickness of the nonvolatile variable resistance body 2 was in the range from about 100 to about 300 nm.

Figure 2:
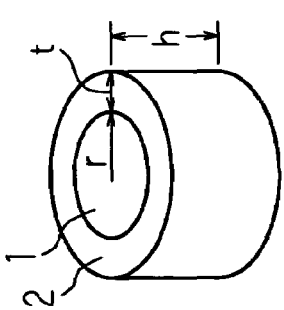
FIG. 2 is a descriptive representation showing that an increase in resistance due to scaling can be suppressed in the nonvolatile variable resistor according to the first embodiment.

FIG. 2 is a descriptive representation showing that an increase in resistance due to scaling can be suppressed in the nonvolatile variable resistor according to the first embodiment. There is shown a case where scaling is applied to the nonvolatile variable resistor Rv at a magnification of 1/k times (k>1). There is shown a way of a change in resistance in a case where no scaling is applied to a film thickness t of the nonvolatile variable resistance body 2. There is additionally shown a way of a change in resistance in a nonvolatile variable resistor Rv of a conventional structure for comparison in a change in resistance caused by scaling. A fundamental calculation method (an approximation method) is as described in FIGS. 1A and 1B. The structures shown include two cases of a column and a prism for the first electrode 1, in which there are shown only the first electrode 1 and the nonvolatile variable resistance body 2 while not showing the second electrode 3 for simplicity of description.

Figure 13A:
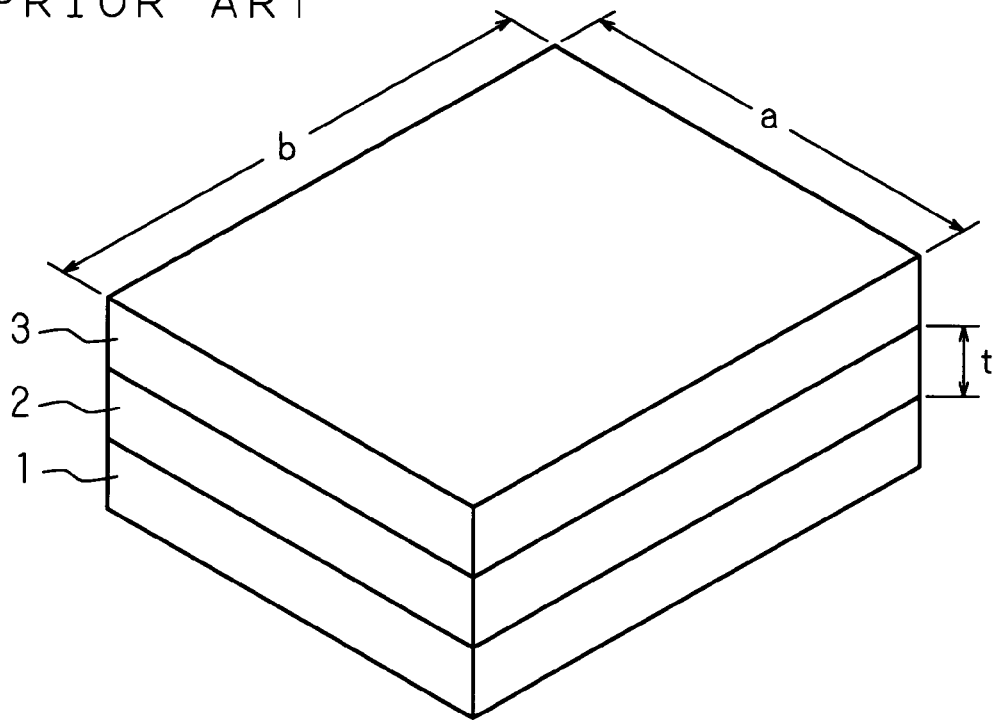
FIGS. 13A and 13B are descriptive views showing a way of scaling in a conventional nonvolatile variable resistor.
Figure 13B:
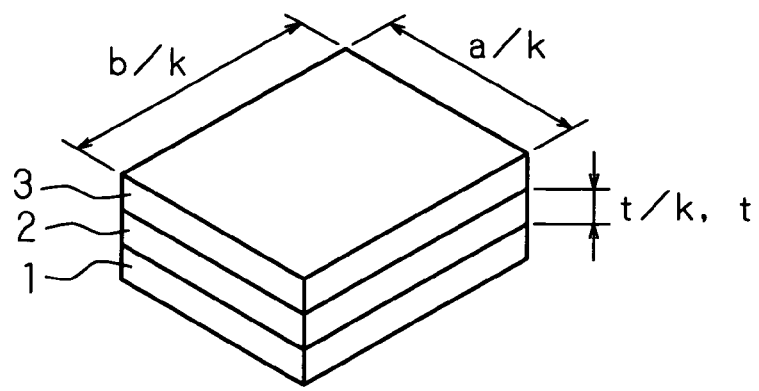
Figure 14A:
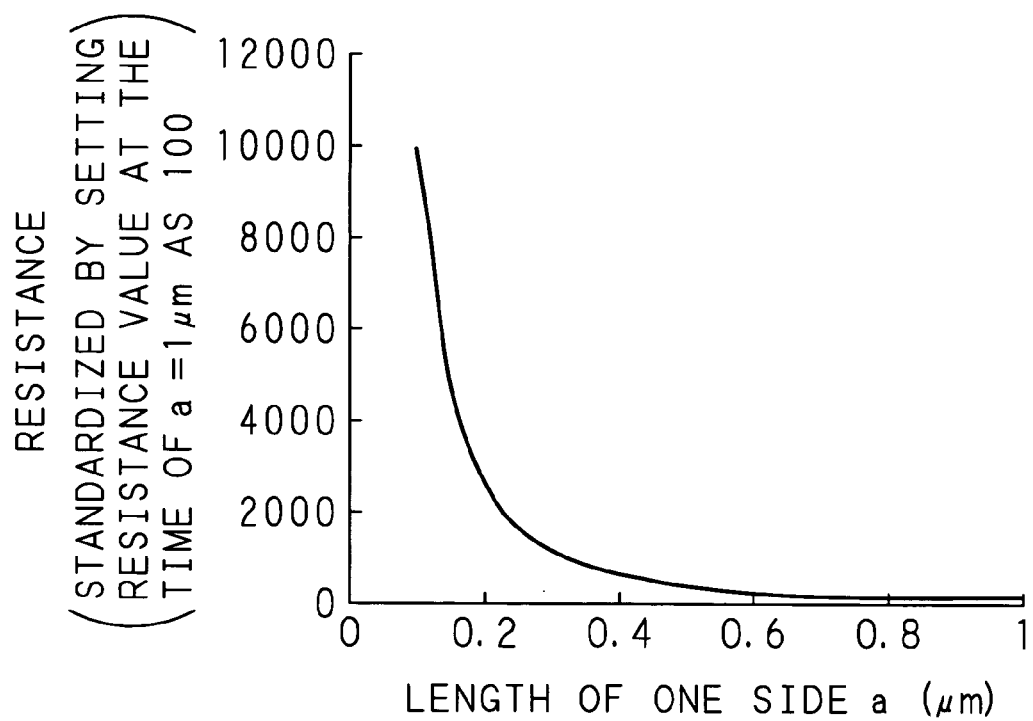
FIGS. 14A and 14B are graphs for describing reduction in characteristic accompanied by an increase in resistance of a nonvolatile variable resistor.
Figure 14B:
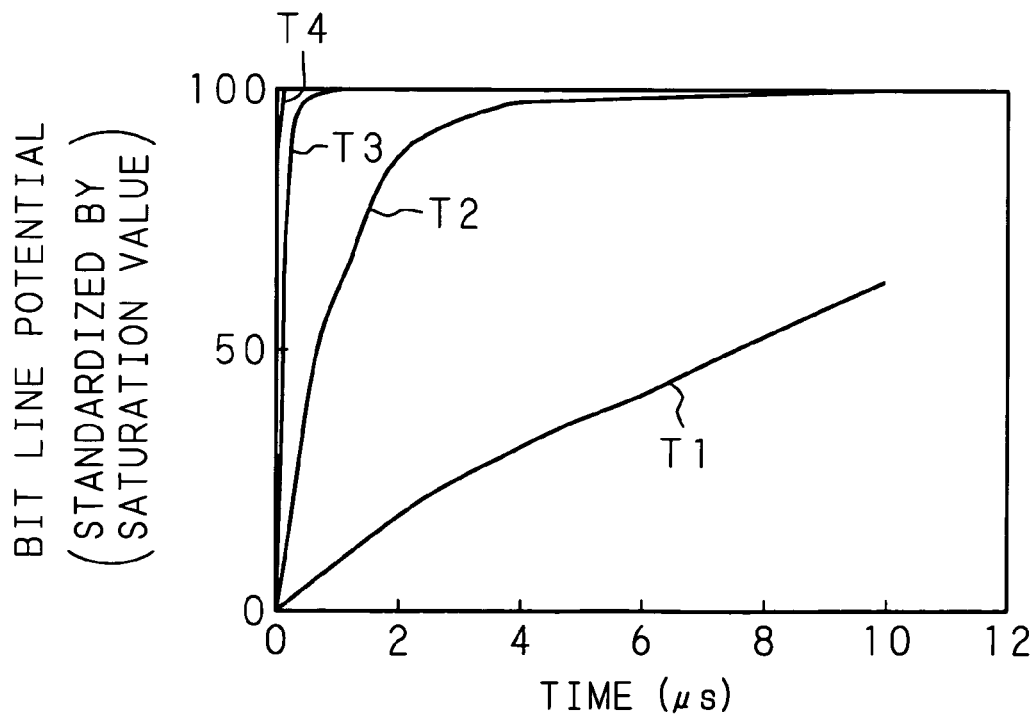

It is assumed that in a case where the first electrode 1 is columnar, a radius is r and a height is h before scaling, and a radius is r/k and a height is h after scaling. It is further assumed that in the same case, a film thickness of the nonvolatile variable resistance body 2 formed cylindrically on an outer surface of the first electrode 1 is t, which is the same before and after scaling. An increase in resistance caused by scaling is as described in FIGS. 1A and 1B and a ratio of Rs/Ro between resistance Rs after scaling and resistance Ro before scaling takes k. On the other hand, Rs/Ro in a conventional structure is $k^2$ (see FIGS. 13A and 13B). That is, a resistance increased in scaling of the nonvolatile variable resistor Rv in a columnar structure can be suppressed to a value 1/k times that of the conventional structure.

It is assumed that in a case where the first electrode 1 is prismatic, a total length of sides is 2(a+b) and a height is h before scaling, and a total length of sides is 2(a+b)/k and a height is h after scaling. It is further assumed that in the same case, a film thickness of the nonvolatile variable resistance body 2 formed in a frame on an outer surface of the first electrode 1 is t, which is the same before and after scaling. Therefore, before scaling, since a surface area So of the first electrode 1 is 2(a+b)h and a film thickness is t, an approximation calculation of the resistance Ro using the surface area So of the first electrode 1 gives Ro=ρt/2(a+b)h. After scaling, since a surface area Ss of the first electrode 1 is 2(a+b)h/k and a film thickness is t, an approximation calculation of the resistance Rs using the surface area Ss of the first electrode 1 gives Rs=ρtk/2(a+b)h=kRo.

Accordingly, in a case where scaling is applied, a ratio Rs/Ro between the resistance Rs after scaling and the resistance Ro before scaling is k. On the other hand, a ratio Rs/Ro in a conventional structure is $k^2$ as described above. That is, an increased resistance in scaling of the nonvolatile variable resistor Rv in a prismatic structure can be suppressed to a value 1/k times that of the conventional structure similarly to the case of the nonvolatile variable resistor Rv in the shape of a column.

FIG. 3 is a descriptive representation showing that an increase in resistance due to scaling can be suppressed in the nonvolatile variable resistor according to the first embodiment. There is shown a case where scaling is applied to the nonvolatile variable resistor Rv at a magnification of 1/k times (k>1). In FIG. 3, there is shown a way of a change in resistance in a case where scaling is also applied to a film thickness t of the nonvolatile variable resistance body 2. Note that there is additionally shown a way of a change in resistance in the nonvolatile variable resistor Rv of a conventional structure for comparison in change in resistance caused by scaling. A fundamental calculation method (an approximation method) is as described in FIGS. 1A and 1B. The structures shown include two cases of a column and a prism for the first electrode 1, in which there are shown only the first electrode 1 and the nonvolatile variable resistance body 2 while not showing the second electrode 3 for simplicity of description.

It is assumed that in a case where the first electrode 1 is columnar, a radius is r and a height is h before scaling, and a radius is r/k and a height is h after scaling similarly to the case of the column of FIG. 2. It is further assumed that in the same case, a film thickness of the nonvolatile variable resistance body 2 formed cylindrically on an outer surface of the first electrode 1 is t before scaling while being t/k after scaling. An increased resistance is as described in FIGS. 1A and 1B and a ratio of Rs/Ro between resistance Rs after scaling and resistance Ro before scaling takes 1 without an increase in resistance. On the other hand, a ratio Rs/Ro in a conventional structure is k (see FIGS. 13A and 13B). That is, an increased resistance in scaling of the nonvolatile variable resistor Rv in a columnar structure can be suppressed to a value 1/k times that of the conventional structure.

It is assumed that in a case where the first electrode 1 is prismatic, a total length of sides is 2(a+b) and a height is h before scaling, and a total length of sides is 2(a+b)/k and a height is h after scaling similarly to the case of the prism of FIG. 2. It is further assumed that in the same case, a film thickness of the nonvolatile variable resistance body 2 formed in a frame on an outer surface of the first electrode 1 is t before scaling while being t/k after scaling. Since a surface area So of the first electrode 1 is 2(a+b)h/k and a film thickness is t before scaling, an approximation calculation of the resistance Ro using the surface area So of the first electrode 1 is Ro=ρt/2(a+b)h similarly to the case of FIG. 2. Since the surface area Ss of the first electrode 1 is 2(a+b)h/k and a film thickness is t/k after scaling, an approximation calculation of the resistance Rs using the surface area Ss of the first electrode 1 is Rs=(ρt/k)/Ss=(ρt/k)/[2(a+b)h/k]=ρt/2(a+b)h=Ro.

Accordingly, in a case where scaling is applied, a ratio Rs/Ro between the resistance Rs after scaling and the resistance Ro before scaling is 1 and no increase in resistance due to scaling occurs. On the other hand, a ratio Rs/Ro in a conventional structure is k as described above. That is, a resistance increased in scaling of the nonvolatile variable resistor Rv in a prismatic structure can be suppressed to a value 1/k times that of the conventional structure similarly to the case of the nonvolatile variable resistor Rv in the shape of a column.

Note that in a case of FIG. 3 where scaling is also applied to film thickness t, it is an indispensable condition that a film thickness t/k after scaling is sufficiently thick, there is no degradation of a film quality of the nonvolatile variable resistance body 2 to be accompanied by reduction in film thickness and no risk of short circuit arises between the first electrode 1 and the second electrode 3. That is, it is only required that proper evaluation is conducted on a characteristic affected by a film thickness of the nonvolatile variable resistance body 2 to be formed to determine whether or not scaling should be applied.

Second Embodiment

Figure 4A:
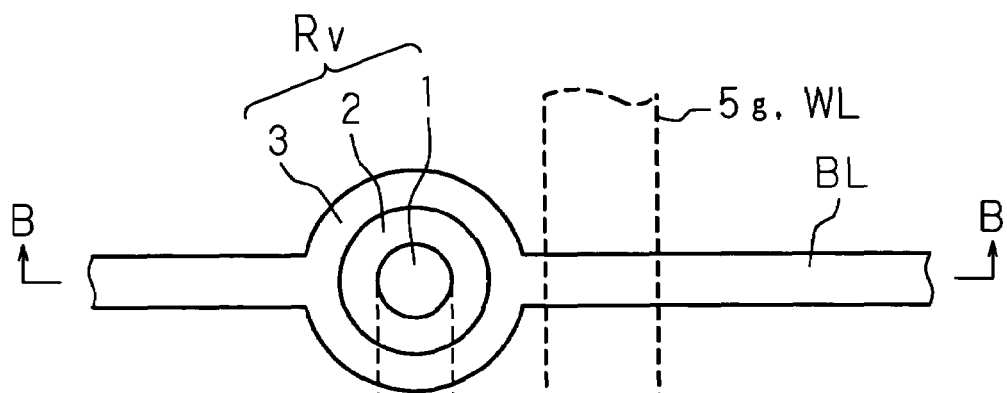
FIGS. 4A and 4B are descriptive views for describing a structure of a 1T1R type memory cell in a memory device according to a second embodiment.
Figure 4B:
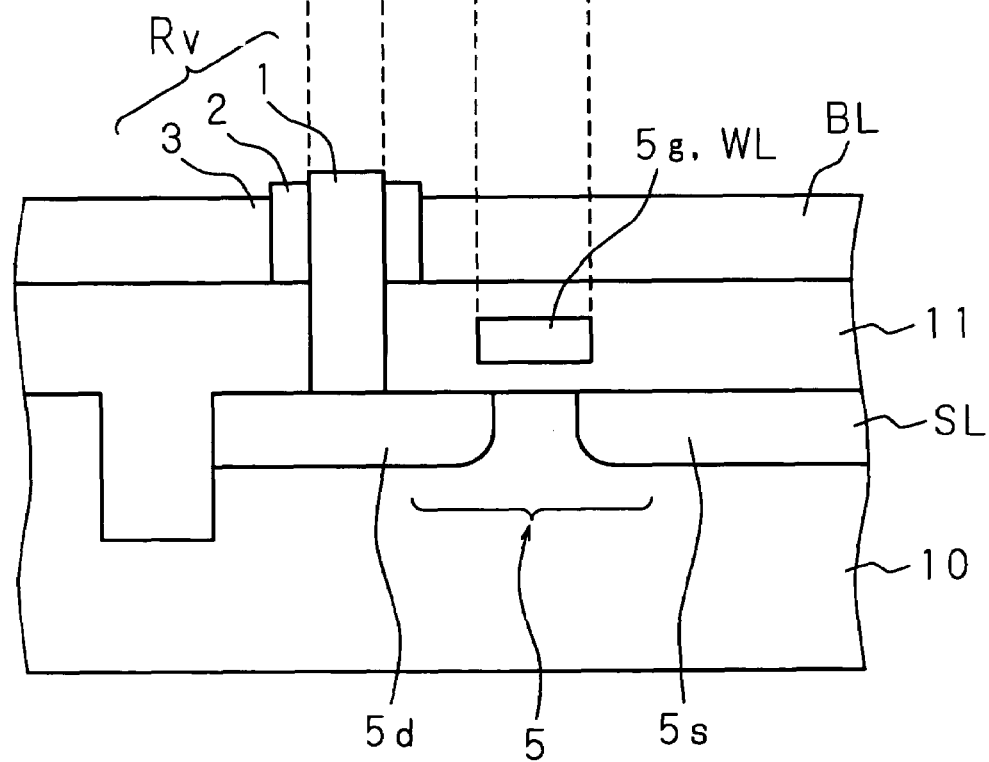

FIGS. 4A and 4B are descriptive views for describing a structure of a 1T1R type memory cell in a memory device according to a second embodiment. There is shown a 1T1R type memory cell using a transistor (a MOS transistor 5) as a selective device for selecting a nonvolatile variable resistor Rv. FIG. 4A shows a schematic plan view and FIG. 4B shows a schematic sectional view taken along line B-B of FIG. 4A. A drain 5d and a source 5s of the MOS transistor 5 are formed on a substrate 10 made of a single crystal silicon or the like. A gate electrode 5g is formed in an insulating layer 11 formed on a surface of the substrate 10 at positions corresponding to the drain 5d and source 5s. The insulating layer 11 is made of, for example, a silicon oxide film and the gate electrode 5g is made of, for example, polysilicon, a high melting point metal or the like. The drain 5d is connected to a first electrode 1 of a nonvolatile variable resistor Rv.

The first electrode 1 is formed on a surface of the insulating layer 11 as an inner electrode in the shape of a column. On the surface of the insulating layer 11, a nonvolatile variable resistance body 2 in the shape of a cylinder is formed on an outer surface of the first electrode 1 in a layer and a second electrode 3 in the shape of a cylinder is formed as an outer electrode on an outer surface of the nonvolatile variable resistance body 2 facing to the first electrode 1. A bit line BL is formed on the surface of the insulating layer 11 and the second electrode 3 is connected to the bit line BL. The gate electrode 5g extends and is connected to a word line WL and the source 5s extends and is connected to a source line SL.

Figure 9:
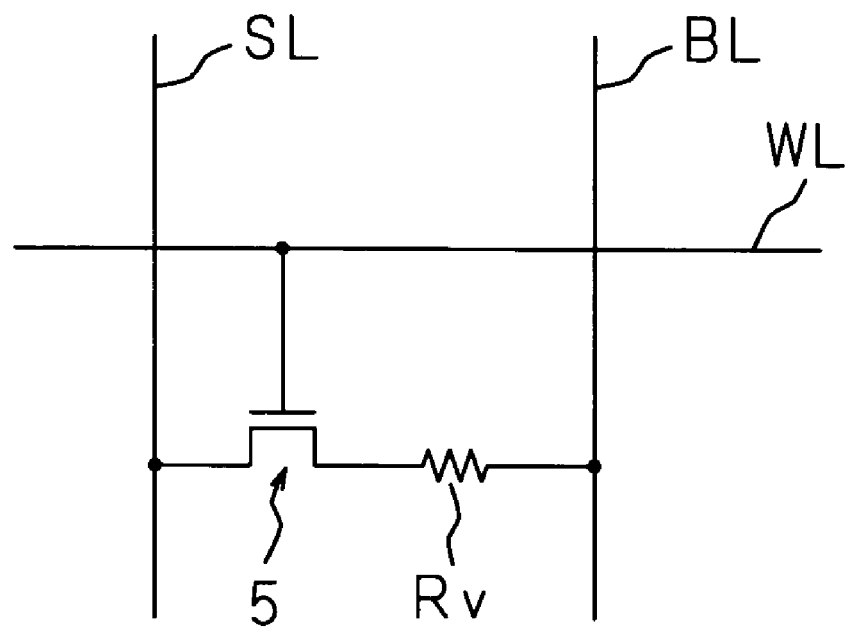
FIG. 9 is a circuit diagram showing an example memory cell in a memory device using a conventional nonvolatile variable resistor.
Figure 11:
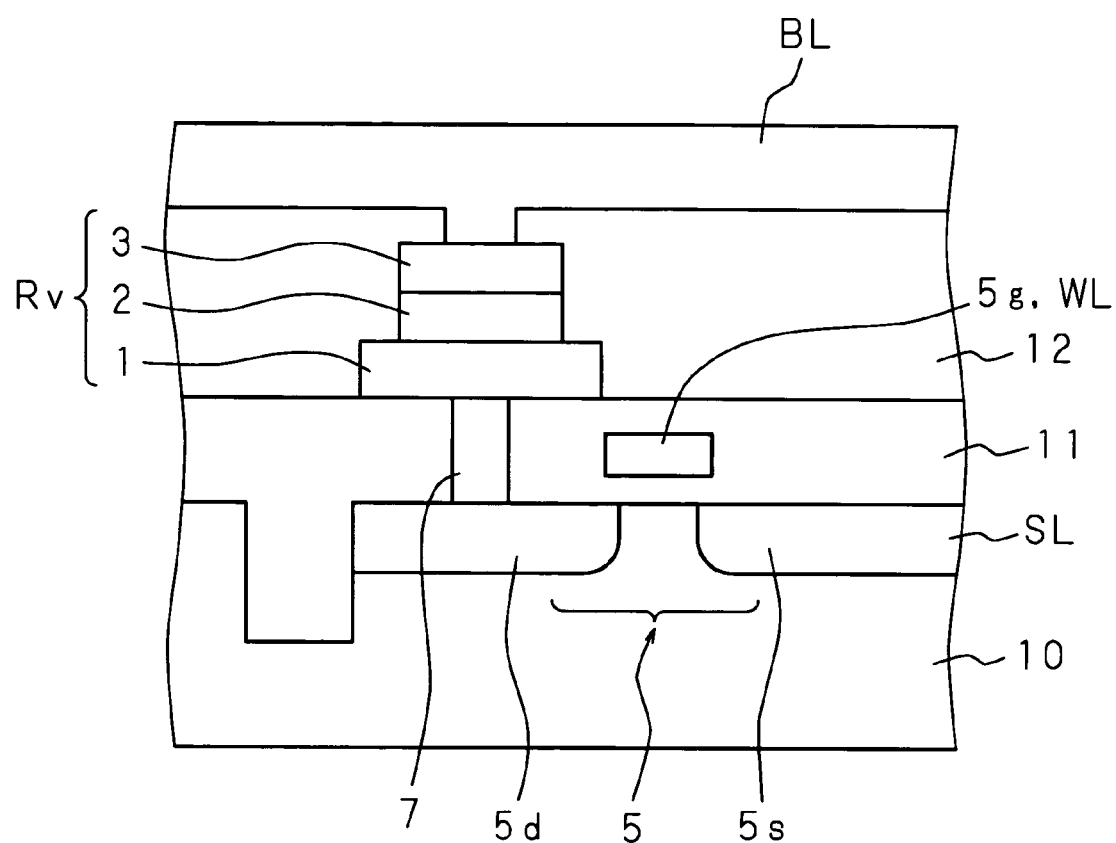
FIG. 11 is a schematic sectional view of a conventional 1T1R type memory cell.

A 1T1R type memory cell is constituted of the MOS transistor 5 and the nonvolatile variable resistor Rv and a circuit configuration thereof is the same as a conventional circuit configuration (see FIGS. 9 and 11). The MOS transistor 5 and the nonvolatile variable resistor Rv can be fabricated in accordance with an ordinary semiconductor process or an improvement thereon. The 1T1R type memory cells (the MOS transistor 5 and the nonvolatile variable resistor Rv) are arranged on the substrate 10 in a matrix to form a memory device according to the invention.

In a case where scaling is applied to a 1T1R type memory cell to reduce a projected area on a plane of the nonvolatile variable resistor Rv to thereby achieve a larger capacity, a memory device with a large capacity in which no reduction in operating speed (an access time) occurs can be realized since an increase in resistance of the nonvolatile variable resistor Rv can be suppressed. Since the second electrode 3, which is an outer electrode, is connected to a bit line, layout is easy and a large capacity can be attained without sacrificing a degree of integration.

In a case where rewrite (write or reset) is conducted, a potential on the word line WL connected to the gate electrode 5g of a memory cell to be selected (hereinafter, referred to as a selective cell) is at first raised to turn on the MOS transistor 5. A potential difference (a voltage) is imparted between the bit line BL and the source line SL of the selective cell to thereby apply a proper voltage between the first electrode 1 and the second electrode 3 of the nonvolatile variable resistor Rv to alter a resistance of the nonvolatile variable resistance body 2. For example, in write, a positive voltage pulse (for example 5 V) is applied onto the bit line BL, while the source line SL is driven to a ground potential (0 V). That is, a potential of the first electrode 1 is set to 0 V while a potential of the second electrode 3 is set to 5 V to thereby enable a resistance of the nonvolatile variable resistance body 2 to be raised (a write operation). In reset, the bit line BL is driven to a ground potential (0 V) while a positive voltage pulse (for example 5 V) is applied onto the source line SL.

That is, since opposite pulses (pluses of different polarities, positive and negative) are applied to the nonvolatile variable resistance body 2 in write and in reset, a resistance of the nonvolatile variable resistance body 2 can be lowered (a reset operation). Note that in a case where in reset, there is applied a voltage pulse of the same polarity (positive) as in write, and having a smaller amplitude (for example 2 to 3 V) and a longer pulse width than in write as well, a reset operation can be conducted in a similar manner. Note that a value (a voltage value) of an applied voltage pulse should be properly adjusted in accordance with a shape (a film thickness t), a material or the like of the nonvolatile variable resistance body 2 and in an ordinary case, a value of the order from 2 to 3 V or more and 5 V or less is preferable from the viewpoint of low power consumption, to which there is no limitation.

While a method of conducting read is fundamentally similar to the case of rewrite, a smaller positive voltage is applied onto the bit line BL or the source line SL (for example 1 V) to prevent read destruction.

Figure 5A:
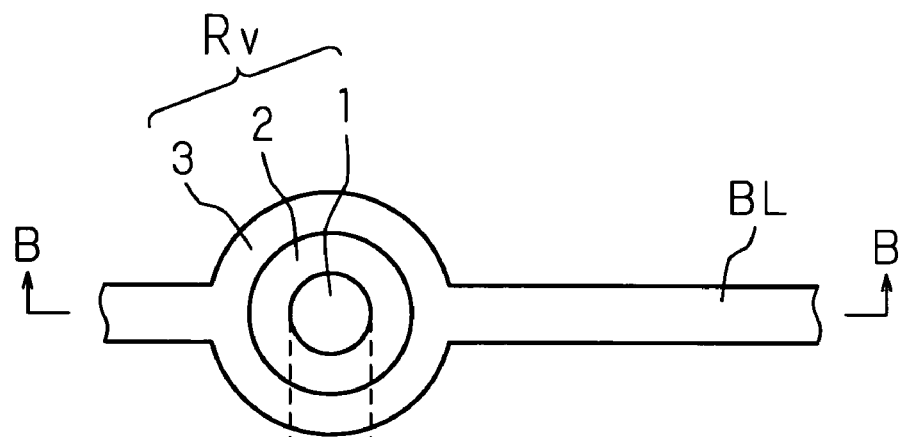
FIGS. 5A and 5B are descriptive views for describing a structure of a 1D1R type memory cell in a memory device according to the second embodiment.
Figure 5B:
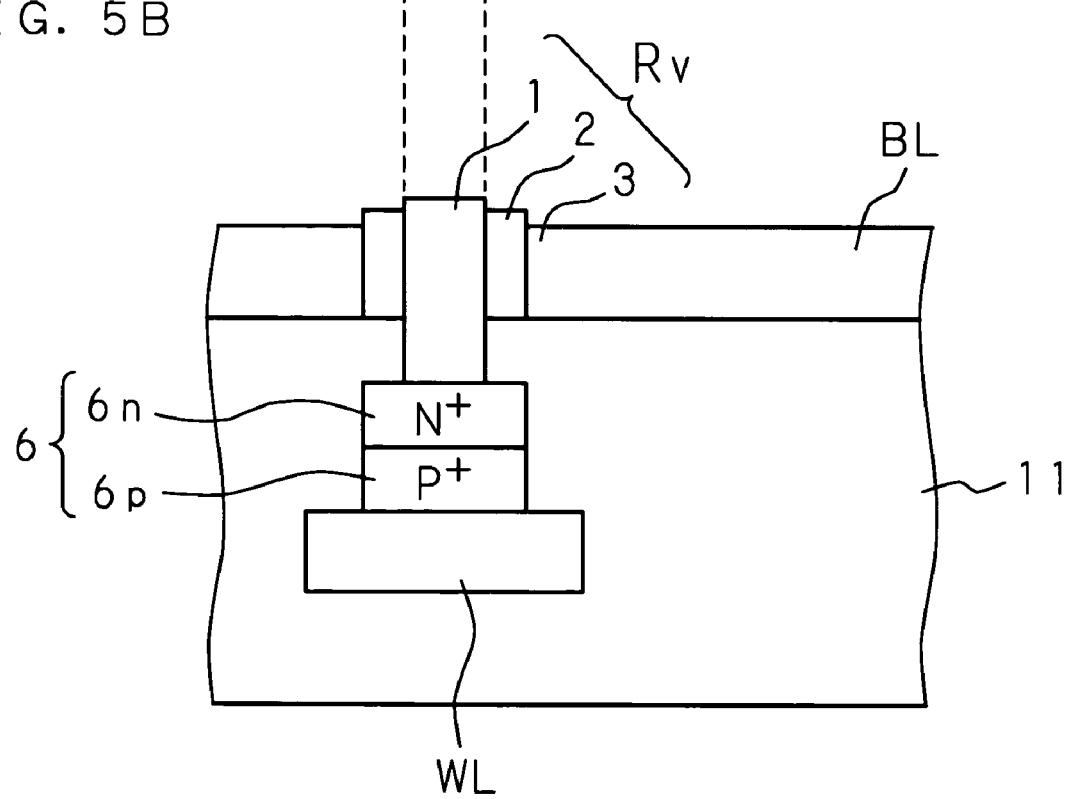

FIGS. 5A and 5B are descriptive views for describing a structure of a 1D1R type memory cell in a memory device according to the second embodiment. There is shown a 1D1R type memory cell using a diode 6 as a selective device for selecting the nonvolatile variable resistor Rv. FIG. 5A shows a schematic plan view and FIG. 5B shows a schematic sectional view taken along line B-B of FIG. 5A. Corresponding constituents similar to those of FIGS. 4A and 4B are denoted by the same symbols as in FIGS. 4A and 4B and descriptions thereof will not be repeated. Note that a substrate 10 is not shown. A word line WL made of, for example, polysilicon is formed on the insulating layer 11 formed on a surface of the substrate 10 and the diode 6, including a semiconductor PN junction, is formed on the word line WL.

An anode 6p (P$^+$) of the diode 6 is connected to the word line WL and a cathode 6n (N$^+$) thereof is connected to the first electrode 1. The first electrode 1 is formed on a surface of the insulating layer 11 as a columnar inner electrode. On the surface of the insulating layer 11, the nonvolatile variable resistance body 2 in the shape of a cylinder is formed on an outer surface of the first electrode 1 in a layer and the second electrode 3 in the shape of a cylinder is formed on an outer surface of the nonvolatile variable resistance body 2 so as to face the first electrode 1 as an outer electrode. The bit line BL is formed on the surface of the insulating layer 11 and the second electrode 3 is connected to the bit line BL.

Figure 10:
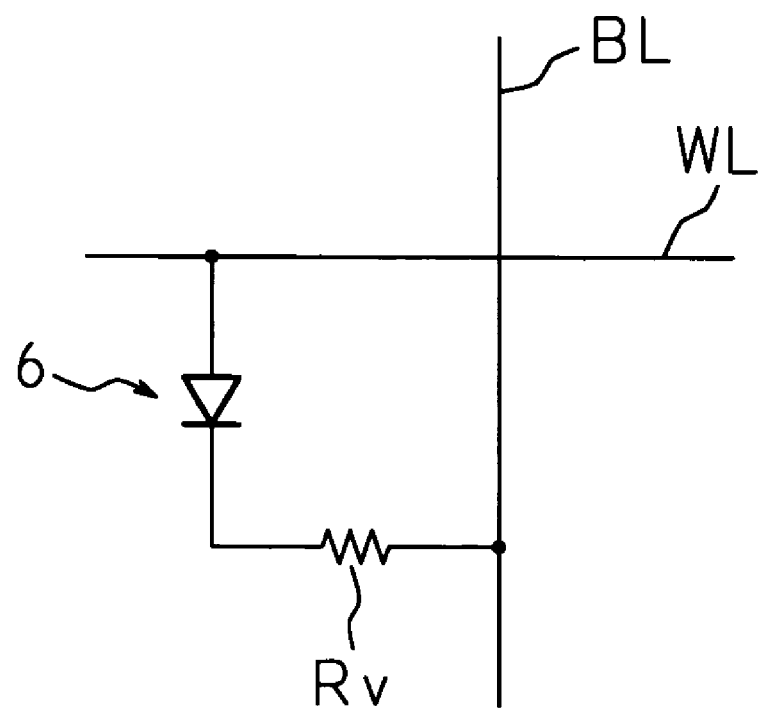
FIG. 10 is a circuit diagram showing an example memory cell in a memory device using a conventional nonvolatile variable resistor.
Figure 12:
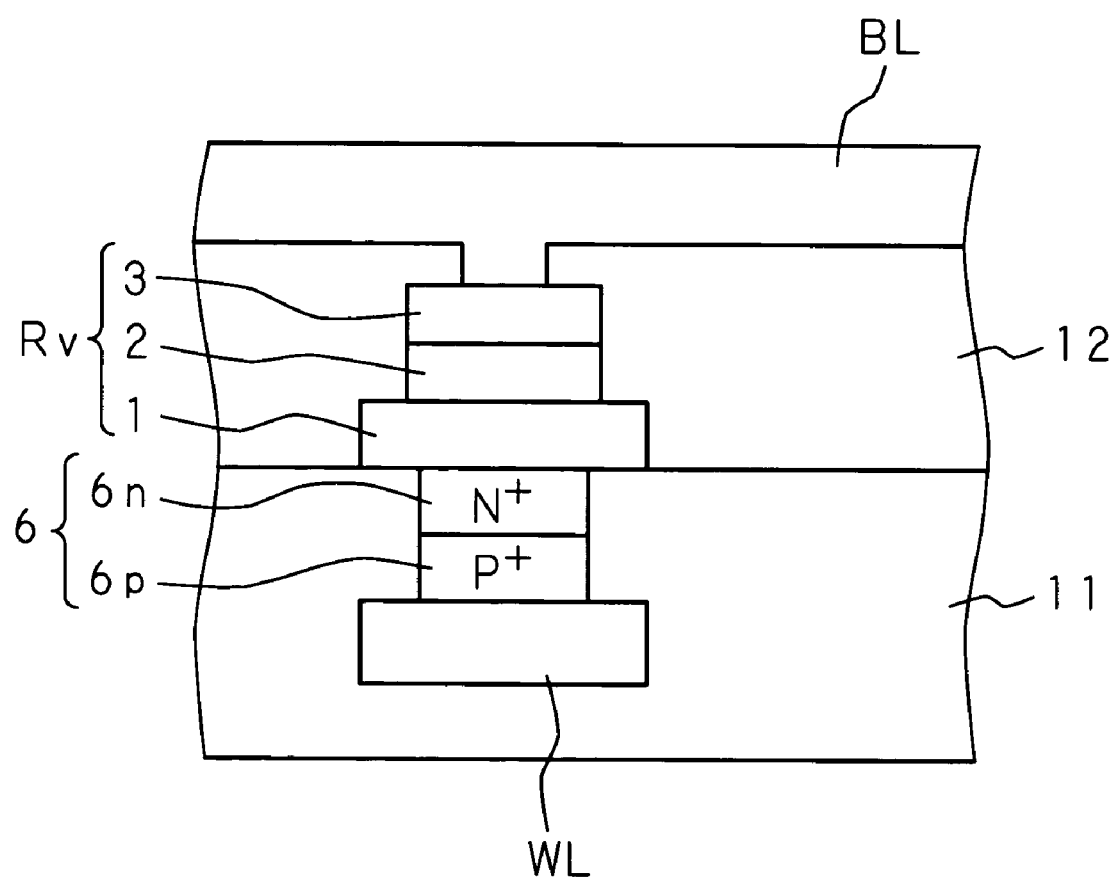
FIG. 12 is a schematic sectional view of a conventional 1D1R type memory cell.

A 1D1R type memory cell is constituted of the diode 6 and the nonvolatile variable resistor Rv and a circuit configuration is the same as the conventional circuit configuration (see FIGS. 10 and 12). The diode 6 and the nonvolatile variable resistor device Rv can be fabricated in an ordinary semiconductor process or an improvement thereof. The 1D1R type memory cells (each including the diode 6 and the nonvolatile variable resistor Rv) are arranged in a matrix on the substrate 10 to form a memory device according to the invention. In a case where scaling is applied to a 1D1R type memory cell to reduce a projected area on a plane of the nonvolatile variable resistor Rv to thereby achieve a larger capacity, a memory device with a large capacity in which no reduction in operating speed (an access time) occurs can be realized since an increase in resistance of the nonvolatile variable resistor Rv can be suppressed. Since the second electrode 3, which is an outer electrode, is connected to a bit line, layout is easy and a large capacity can be attained without sacrificing a degree of integration.

In a case where rewrite (write or reset) is conducted, a potential on the word line WL connected to a selective cell is raised, while the bit line BL of the selective cell is driven to a ground potential to impart a potential difference (a voltage) between the word line WL and the it line BL of the selective cell and to thereby apply a proper voltage between the first electrode 1 and the second electrode 3 of the nonvolatile variable resistor Rv and alter a resistance of the nonvolatile variable resistance body 2. For example, in write, a positive voltage pulse (for example 5 V) is applied onto the word line WL while the bit line BL is driven to a ground voltage (0 V). That is, a potential of the first electrode 1 is set to 5 V and a potential of the second electrode 3 is set to 0 V to thereby enable a resistance of the nonvolatile variable resistance body 2 to be raised (a write operation).

Note that in memory cells other than a selective cell (the memory cells being hereinafter referred to as non-selective cells), a potential on the word line WL is set to a ground potential while a potential on the bit line BL is set to a positive potential (the same potential as the potential applied onto the word line WL of the selective cell, for example 5 V) to thereby cause a rectifying action of the diode 6 to work so as not to apply a voltage to the non-selective cells. In reset, by applying a voltage pulse of the same polarity (positive) as in write, having an amplitude smaller than in write (for example, 2 to 3 V), and having a pulse width longer than in write, a resistance of the nonvolatile variable resistance body 2 can be reduced (a reset operation).

A procedure and workings thereof in a case where read is conducted is fundamentally similar to those in a case where rewrite is conducted, while in read, a positive voltage applied onto the bit line BL (or the source line SL) is rendered smaller (for example, 1 V) to prevent read destruction from occurring.

Third Embodiment

Figure 6A:
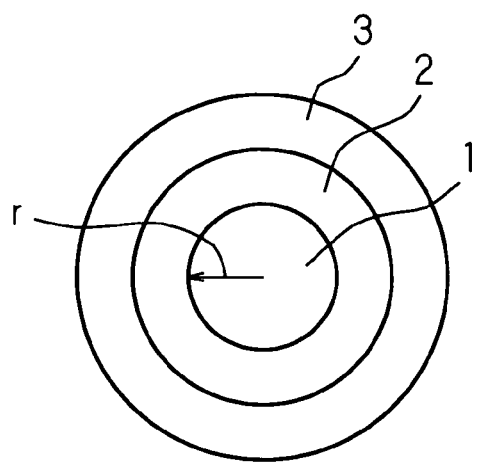
FIGS. 6A to 6D are descriptive views for describing a way of scaling in a nonvolatile variable resistor according to a third embodiment.
Figure 6C:
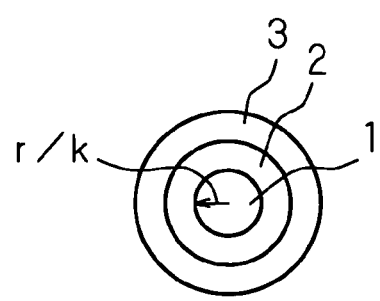
Figure 6B:
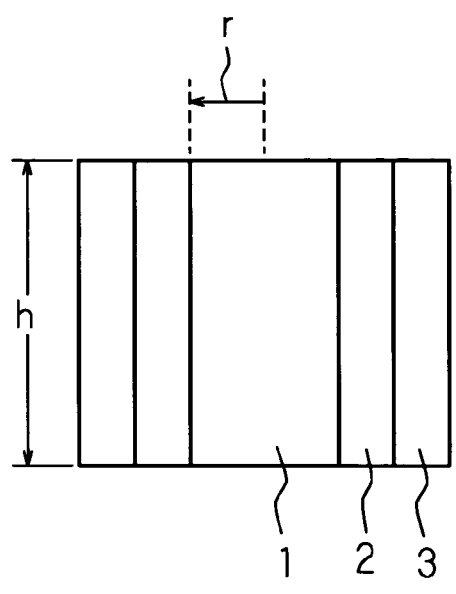
Figure 6D:
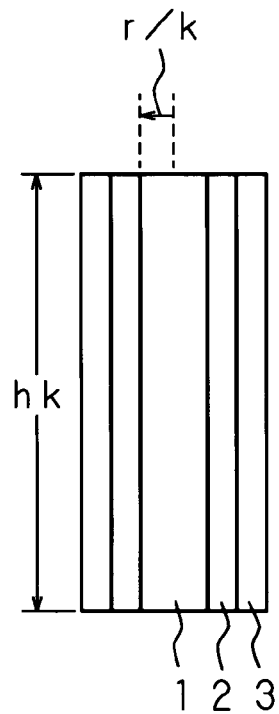
Figure 7:
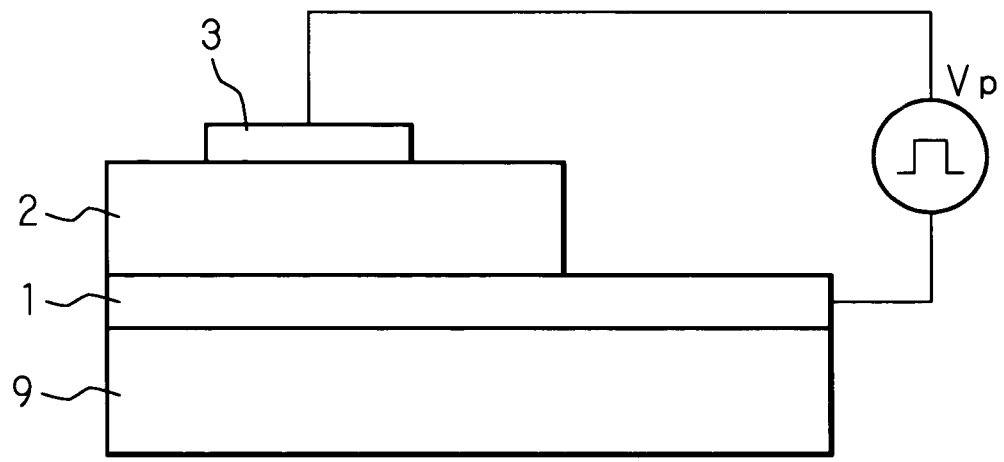
FIG. 7 is a descriptive view showing an outline of a memory device using a conventional nonvolatile variable resistor.
Figure 8:
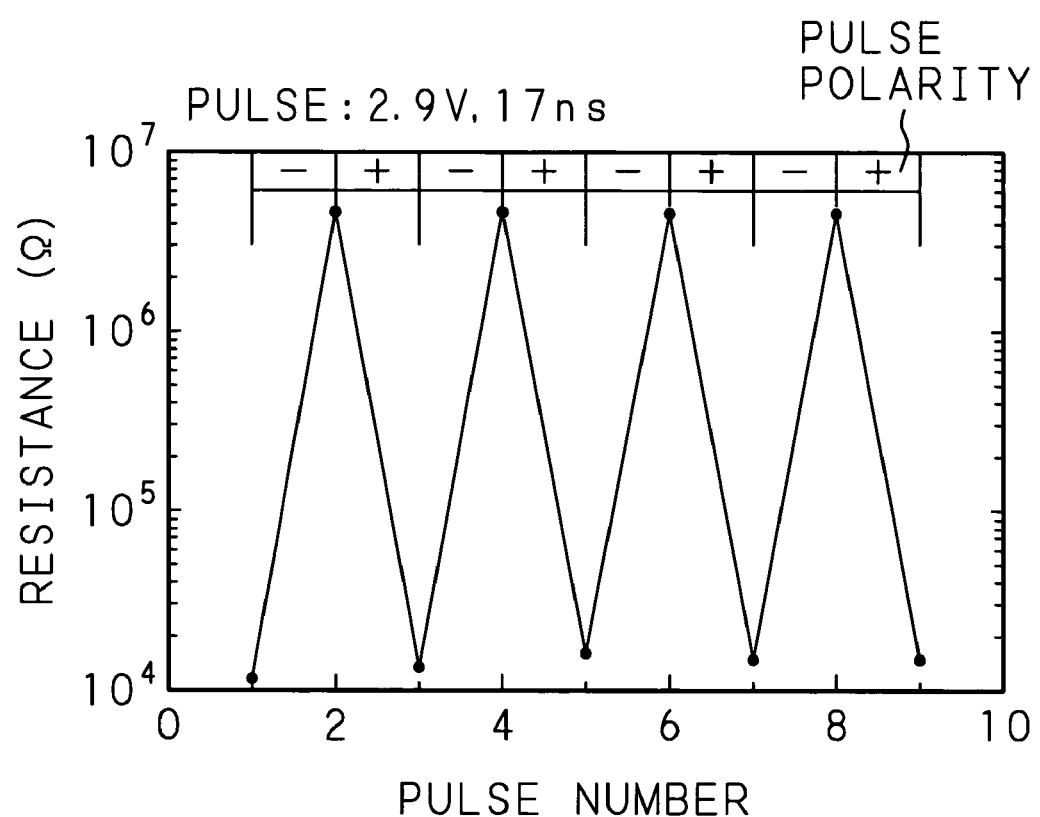
FIG. 8 is a graph showing a way of a change in resistance value with respect to application of a voltage pulse in the memory device of FIG. 7.

FIGS. 6A to 6D are descriptive views for describing a way of scaling in a nonvolatile variable resistor according to a third embodiment. FIG. 6A is a plan view of a nonvolatile variable resistor Rv (of a columnar structure) before scaling, and FIG. B is a sectional view taken along a radial direction of FIG. 6A. FIG. 6C is a plan view of a nonvolatile variable resistor Rv after scaling is applied to the nonvolatile variable resistor Rv in FIG. 6A at a magnification of 1/k times (k>1), and FIG. 6D is a sectional view taken along a radial direction of FIG. 6C.

Similar to the cases of the first and second embodiments, a first electrode 1 is formed as a column, a nonvolatile variable resistance body 2 in the shape of a cylinder is formed on an outer surface of the first electrode 1 and a second electrode 3 in the shape of a cylinder is further formed as an outer electrode on an outer surface of the nonvolatile variable resistance body 2 so as to face the first electrode 1. Note that in the third embodiment, scaling is applied to the direction of a height at a magnification of k times (that is a magnification scaling is applied to a height, while ordinary reduction scaling is applied to a plane).

In FIGS. 6A and 6B, if a radius of the first electrode 1 is r, a circumference is $2\pi r$ and a height is h; therefore, a surface area So of the first electrode 1 facing the nonvolatile variable resistance body 2 is $2\pi rh$. A resistance Ro before scaling using the surface area So of the first electrode 1 approximates Ro=$\rho t/2\pi rh$, wherein a film thickness of the nonvolatile variable resistance body 2. On the other hand, in FIGS. 6C and 6D, the surface area Ss of the first electrode 1 facing the nonvolatile variable resistance body 2 is $(2\pi r/k)\times(hk)=2\pi rh$ with the surface area Ss after scaling being not changed. That is, no reduction occurs in the surface area of the first electrode 1 to be caused by scaling, which is different from the case of a conventional technique.

Since a film thickness t of the nonvolatile variable resistance body 2 is altered to a film thickness t/k after scaling is applied thereto in a similar manner, a resistance Rs of the first electrode 1, after scaling, using the surface area thereof Ss approximates Rs=$(\rho t/k)/Ss=(\rho t/k)/2\pi rh=\rho t/2\pi rhk$=Ro/k. That is, a ratio Rs/Ro between a resistance Rs after scaling and a resistance Ro before scaling is 1/k, thereby enabling not only increase in resistance due to scaling to be prevented, but also reduction in resistance due to scaling to be achieved. Since a film thickness t of the nonvolatile variable resistance body 2 in a case where no scaling is applied to a film thickness t thereof is unchanged to be t, a resistance Rs after scaling using the surface area Ss of the first electrode 1 approximates Rs=$\rho t/2\pi rh$=Ro. That is, a ratio Rs/Ro between a resistance Rs after scaling and a resistance Ro before scaling is 1, thereby enabling an increase in resistance due to scaling to be prevented in a similar manner to that in the case of the first embodiment (FIG. 3).

Note that while reduction scaling is applied to planar dimensions of the first electrode 1 at a magnification of 1/k times (k>1) and magnification scaling is applied to a height of the first electrode at a magnification of k times (k>1), a scaling constant (1/k in reduction scaling applied to planar dimensions and k in magnification scaling applied to a height dimension) is unnecessary to be used as a reciprocal, and, needless to say, may be a proper different value. For example, the scaling constants can be such that in reduction scaling, a magnification is set to ½ times (k=2) and in magnification scaling, a magnification is set to 1.5 times (k=1.5) or 2.5 times (k=2.5).

In accordance with a scaling method of a nonvolatile variable resistor according to the third embodiment, since an increase in a surface area Ss of the first electrode 1 can be prevented in a case where a projected area on a plane of the first electrode 1 is reduced, an increase in resistance of the nonvolatile variable resistor Rv can be prevented or scaling capable of reducing a resistance can be conducted. That is, no increase occurs in resistance accompanied by reduction in a surface area of the first electrode 1 in scaling, which has otherwise occurred in a conventional technique. Accordingly, by applying a scaling method of a nonvolatile variable resistor according to the third embodiment to the memory device (a memory cell) of the second embodiment, there can be realized a memory device having a large capacity in which no operating speed is reduced therein.

In the technology described herein, a nonvolatile variable resistor in which an increase in resistance due to scaling is suppressed can be realized in a case where scaling is applied to reduce a projected area on a plane of the nonvolatile variable resistor.

In the technology described herein, there can be realized a memory device with a large capacity in which no reduction in an operating speed (an access time) occurs since an increase in resistance of a nonvolatile variable resistor due to scaling can be suppressed in a case where scaling is applied to a nonvolatile variable resistor constituting the memory cell to reduce a projected area on a plane of the memory cell.

In the technology described herein, there can be realized a scaling method of a nonvolatile variable resistor capable of suppressing an increase in resistance due to scaling by applying magnification scaling to the direction of a height in a case where an reduction scaling is applied to reduce a projected area on a plane of the nonvolatile variable resistor.

As this technology may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A nonvolatile variable resistor comprising:
a first electrode and a second electrode facing each other and formed on a substrate; a nonvolatile variable resistance body formed between the first electrode and the second electrode, wherein the first electrode having a first electrode major dimension and the second electrode having a second electrode major dimension, and wherein the first electrode major dimension and the second electrode major dimension extend in a direction perpendicular to a surface of the substrate and the first electrode major dimension and the second electrode major dimension face each other in a direction parallel to the surface of the substrate, wherein the nonvolatile variable resistance body is formed on an outer surface of the first electrode, and the second electrode is formed on an outer surface of the nonvolatile variable resistance body.

2. A nonvolatile variable resistor according to claim 1, wherein the first electrode is columnar or prismatic.

3. A nonvolatile variable resistor according to claim 2, wherein the nonvolatile variable resistance body is made of a manganese oxide of a perovskite structure.

4. A nonvolatile variable resistor according to claim 3, wherein the manganese oxide is any of $Pr_{(1-x)}Ca_xMnO_3$, $La_{(1-x)}Ca_xMnO_3$, and $La_{(1-x-y)}Ca_xPb_yMnO_3$.

5. A nonvolatile variable resistor according to claim 4, wherein the manganese oxide is any of $Pr_{0.7}Ca_{0.3}MnO_3$, $La_{0.65}Ca_{0.35}MnO_3$ and $La_{0.65}Ca_{0.175}Pb_{0.175}MnO_3$.

6. A nonvolatile variable resistor according to claim 1, wherein the nonvolatile variable resistance body is made of a manganese oxide of a perovskite structure.

7. A nonvolatile variable resistor according to claim 6, wherein the manganese oxide is any of $Pr_{(1-x)}Ca_xMnO_3$, $La_{(1-x)}Ca_xMnO_3$, and $La_{(1-x-y)}Ca_xPb_yMnO_3$.

8. A nonvolatile variable resistor according to claim 7, wherein the manganese oxide is any of $Pr_{0.7}Ca_{0.3}MnO_3$, $La_{0.65}Ca_{0.35}MnO3$ and $La_{0.65}Ca_{0.175}Pb_{0.175}MnO_3$.

9. A nonvolatile variable resistor comprising:
a first electrode and a second electrode facing each other and formed on a substrate;
a semiconductor switching element formed in the substrate, the switching element being connected to the first electrode;
a nonvolatile variable resistance body formed between the first electrode and the second electrode, a composition of the nonvolatile variable resistance body being chosen to facilitate nonvolatility of the variable resistor;
wherein the first electrode having first electrode major dimension and the second electrode having a second electrode major dimension, and wherein the first electrode major dimension and the second electrode major dimension extend in a direction perpendicular to a surface of the substrate and the first electrode major dimension and the second electrode major dimension face each other in a direction parallel to the surface of the substrate, wherein the nonvolatile variable resistance body is formed on an outer surface of the first electrode, and wherein the second electrode is formed on an outer surface of the nonvolatile variable resistance body.

10. A nonvolatile variable resistor according to claim 9, wherein the first electrode is columnar or prismatic.

11. A nonvolatile variable resistor comprising:
a first electrode and a second electrode facing each other and formed on a substrate; and
a nonvolatile variable resistance body, a read-out resistance value of which varies by applying a voltage pulse between the first electrode and the second electrode, formed between the first electrode and the second electrode, wherein
the first electrode having a first electrode major dimension and the second electrode having a second electrode major dimension, and wherein the first electrode major dimension and the second electrode major dimension extend in a direction perpendicular to a surface of the substrate and the first electrode major dimension and the second electrode major dimension face each other in a direction parallel to the surface of the substrate.

12. A nonvolatile variable resistor according to claim 11, wherein
the nonvolatile variable resistance body is made of a manganese oxide of a perovskite structure.

13. A nonvolatile variable resistor according to claim 12, wherein the manganese oxide is any of $Pr_{(1-x)}Ca_xMnO_3$, $La_{(1-x)}Ca_xMnO_3$, and $La_{(1-x-y)}Ca_xPb_yMnO_3$.

14. A nonvolatile variable resistor according to claim 13, wherein the manganese oxide is any of $Pr_{0.7}Ca_{0.3}MnO_3$, $La_{0.65}Ca_{0.35}MnO_3$ and $La_{0.65}Ca_{0.175}Pb_{0.175}MnO_3$.

15. A nonvolatile variable resistor according to claim 11, wherein the second electrode is concentric about the first electrode.

16. A memory cell comprising:
a nonvolatile variable resistor; and
a selective device, connected to the nonvolatile variable resistor, for selecting variable resistor, wherein the nonvolatile variable resistor comprising:
a first electrode and a second electrode facing each other and formed on a substrate; and
a nonvolatile variable resistance body, a resistance value of which varies reversibly by applying a voltage pulse between the first electrode and the second electrode, formed between the first electrode and the second electrode, and
the first electrode having a first electrode major dimension and the second electrode having a second electrode major dimension, and wherein the first electrode major dimension and the second electrode major dimension extend in a direction perpendicular to a surface of the substrate and the first electrode major dimension and the second electrode major dimension face each other in a direction parallel to the surface of the substrate.

* * * * *